United States Patent
Aqad et al.

(10) Patent No.: US 10,495,968 B2
(45) Date of Patent: Dec. 3, 2019

(54) IODINE-CONTAINING POLYMERS FOR CHEMICALLY AMPLIFIED RESIST COMPOSITIONS

(71) Applicant: Rohm and Haas Electronic Materials LLC, Marlborough, MA (US)

(72) Inventors: Emad Aqad, Northborough, MA (US); James W. Thackeray, Braintree, MA (US); James F. Cameron, Brookline, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 15/623,892

(22) Filed: Jun. 15, 2017

(65) Prior Publication Data

US 2018/0362752 A1 Dec. 20, 2018

(51) Int. Cl.
| | |
|---|---|
| G03F 7/004 | (2006.01) |
| C08L 73/00 | (2006.01) |
| C08L 81/06 | (2006.01) |
| C08L 81/08 | (2006.01) |
| G03F 7/20 | (2006.01) |
| C08L 27/10 | (2006.01) |
| H01L 21/027 | (2006.01) |
| C08F 16/24 | (2006.01) |
| C08L 27/00 | (2006.01) |
| C08F 220/28 | (2006.01) |
| G03F 7/039 | (2006.01) |

(52) U.S. Cl.
CPC .............. *G03F 7/004* (2013.01); *C08F 16/24* (2013.01); *C08F 220/28* (2013.01); *C08L 27/00* (2013.01); *C08L 27/10* (2013.01); *C08L 73/00* (2013.01); *C08L 81/06* (2013.01); *C08L 81/08* (2013.01); *G03F 7/0045* (2013.01); *G03F 7/0046* (2013.01); *G03F 7/0392* (2013.01); *G03F 7/0397* (2013.01); *G03F 7/2002* (2013.01); *H01L 21/0274* (2013.01); C08F 2220/283 (2013.01)

(58) Field of Classification Search
CPC ...... G03F 7/2002; G03F 7/038; G03F 7/0388; G03F 7/004; G03F 7/0045; G03F 7/0046; H01L 21/0274; C08F 16/24; C08L 27/00; C08L 27/10
USPC ...................... 430/270.1, 322, 329
See application file for complete search history.

(56) References Cited

U.S. PATENT DOCUMENTS

| 4,644,025 A | 2/1987 | Sakagami et al. |
| 5,679,710 A | 10/1997 | Davy et al. |
| 5,780,668 A | 7/1998 | Rheinberger et al. |
| 7,862,800 B1 | 1/2011 | Broadley et al. |
| 2009/0275671 A1 | 11/2009 | Koole et al. |
| 2009/0311192 A1* | 12/2009 | Margel ................. A61K 47/489 424/9.4 |
| 2013/0225778 A1 | 8/2013 | Goodrich et al. |
| 2015/0374884 A1* | 12/2015 | Goodrich .............. C08F 220/30 522/172 |

FOREIGN PATENT DOCUMENTS

| EP | 0684222 A1 | 11/1995 |
| JP | 2015-161823 A | 9/2015 |
| TW | 201533778 A | 9/2015 |
| WO | 2014124225 A1 | 8/2014 |

OTHER PUBLICATIONS

Christianson et al. "High Absorbing Resists Based on Trifluoromethacrylate-Vinyl Ether Copolymers for EUV Lithography" Proc. of SPIE vol. 8682 868216 (11 pages).

Fallica et al. "Dynamic absorption coefficients of CAR and non-CAR resists at EUV" Proc. of SPIE vol. 9776, 977612 (2016) (10 pages).

Mack et al. "Stochastic exposure kinetics of extreme ultraviolet photoresists: simulation study" J. Micro/Nanolith. MEMS MOEMS 10(3), 033019 (Jul.-Sep. 2011) (11 pages).

Saralidze et al. "Injectable Polymeric Microspheres with X-ray Visibility. Preparation, Properties, and Potential Utility as New Traceable Bulking Agents" Biomacromolecules 2003, vol. 4, 793-798.

Thackeray et al. "Optimization of Polymer-bound PAG (PBP) for 20nm EUV Lithography" Journal of Photopolymer Science and Technology vol. 24, No. 2 (2011) 179-188.

Thackeray, J.W. "Materials challenges for sub-20-nm lithography" Journal of Micro/Nanolighography, MEMS, and MOEMS 10(3), 033009 (Jul.-Sep. 2011) (9 pages).

\* cited by examiner

*Primary Examiner* — Amanda C. Walke
(74) *Attorney, Agent, or Firm* — Cantor Colburn LLP

(57) ABSTRACT

A monomer having formula (I):

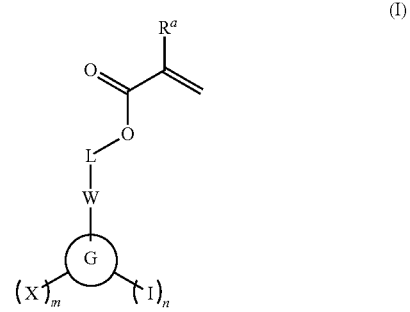

wherein in formula (I), groups and variables are the same as described in the specification.

14 Claims, No Drawings

IODINE-CONTAINING POLYMERS FOR CHEMICALLY AMPLIFIED RESIST COMPOSITIONS

FIELD

The present disclosure generally relates to polymer compositions including a photoacid generator. Specifically, the disclosure provides copolymers derived from an iodine-containing monomer.

BACKGROUND

Extreme ultraviolet lithography ("EUVL") is one of the leading technology options to replace optical lithography for volume semiconductor manufacturing at feature sizes <20 nm. The extremely short wavelength (13.4 nm) is a key enabling factor for high resolution required at multiple technology generations. In addition, the overall system concept—scanning exposure, projection optics, mask format, and resist technology—is quite similar to that used for current optical technologies. Like previous lithography generations, EUVL consists of resist technology, exposure tool technology, and mask technology. The key challenges are EUV source power and throughput. Any improvement in EUV power source will directly impact the currently strict resist sensitivity specification. Indeed, a major issue in EUVL imaging is resist sensitivity, the lower the sensitivity, the greater the source power that is needed or the longer the exposure time that is required to fully expose the resist. The lower the power levels, the more noise affects the line edge roughness ("LER") of the printed lines.

Improving extreme ultraviolet ("EUV") sensitivity is a key enabling factor. It has been shown that EUV light absorption cross-section and secondary electron generation yield are critical factors for EUV sensitivity. One way to increase EUV photoresist sensitivity is by increasing its absorption cross-section at 13.5 nm, which is an atomic property of the material that can be theoretically calculated using known atomic absorptions. Typical atoms that make up resist materials, such as carbon, oxygen, hydrogen, and nitrogen possess very weak absorption at 13.5 nm. A fluorine atom has slightly higher absorption and has been used in the search for high EUV absorbing photoresist.

Iodine has remarkably high absorption cross-section at EUV radiation. Recent patent application JP 2015-161823 discloses iodine-containing monomers and corresponding polymers useful for lithographic processing. However none of these monomers contemplated an extended chain to improve the incorporation of iodine-containing monomers. There is still a need for iodine-rich monomers and corresponding polymers that possess good solubility and that imparts improved sensitivity under EUV exposure.

SUMMARY

An embodiment provides a monomer having formula (I):

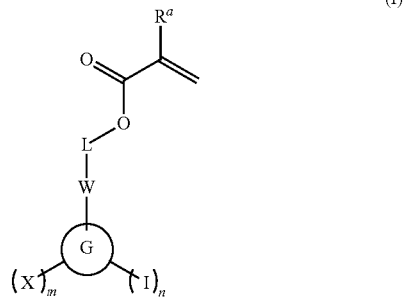

wherein in formula (I):

W is —(C═O)O—, —O(C═O)—, —O(SO$_2$)—, —(SO$_2$)O—, —NH(SO$_2$)—, —(SO$_2$)NH—, —NH(CO)—, —(CO)NH—, —SO$_2$—, —SO—, $R^a$ is H, F, —CN, a $C_{1-10}$ alkyl group, or a $C_{1-10}$ fluoroalkyl group;

L is a linking group selected from an unsubstituted or substituted $C_{1-20}$ alkylene group, an unsubstituted or substituted $C_{3-20}$ cycloalkylene group, an unsubstituted or substituted $C_{6-20}$ arylene group, and an unsubstituted or substituted $C_{7-20}$ aralkylene group;

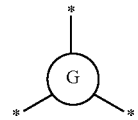

represents a monocyclic or polycyclic unsubstituted or substituted $C_{6-30}$ arylene group or a monocyclic or polycyclic unsubstituted or substituted $C_{3-30}$ heteroarylene group, wherein "*" indicates a point of attachment to a neighboring group or atom;

"I" represents iodine;

X is selected from —F, —Cl, —Br, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group, wherein X optionally includes an ester group or —C(CF$_3$)$_2$OH;

m is an integer of 0 or greater, provided that when m is an integer of 2 or greater, two adjacent groups X optionally form a ring; and n is an integer of 1 or greater.

Another embodiment provides a copolymer including a polymerized product of the above monomer and an acid-deprotectable monomer.

Still another embodiment provides a photoresist composition including the above polymer and a coated substrate including a layer of the photoresist composition.

Yet another embodiment provides a method of forming an electronic device, including:

(a) applying a layer of the photoresist composition of any of claims 11 to 13 over a surface of the substrate;

(b) pattern-wise exposing the photoresist composition layer to activating radiation; and (c) developing the exposed photoresist composition layer to provide a resist relief image.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "fluoroalkyl group" refers to an alkyl group in which one or more hydrogen atoms are replaced with fluorine atoms.

As used herein, when a definition is not otherwise provided, the term "alkoxy group" refers to "alkyl-O—", wherein the term "alkyl" has the same meaning as described above.

As used herein, when a definition is not otherwise provided, the term "fluoroalkoxy group" refers to an alkoxy group in which one or more hydrogen atoms are replaced with fluorine atoms.

As used herein, when a definition is not otherwise provided, the term "cycloalkyl group" refers to a monovalent group having one or more saturated rings in which all ring members are carbon.

As used herein, when a definition is not otherwise provided, the term "alkenyl group" refers to a straight or branched chain, monovalent hydrocarbon group having at least one carbon-carbon double bond.

As used herein, when a definition is not otherwise provided, the term "alkenylalkyl group" refers to "alkenyl-alkyl-", wherein the terms "alkenyl" and "alkyl" have the same meaning as described above.

As used herein, when a definition is not otherwise provided, the term "alkynyl group" refers to a straight or branched chain, monovalent hydrocarbon group having at least one carbon-carbon triple bond.

As used herein, when a definition is not otherwise provided, the term "alkynylalkyl group" refers to "alkynyl-alkyl-", wherein the terms "alkynyl" and "alkyl" have the same meaning as described above.

As used herein, when a definition is not otherwise provided, the term "aryl", which is used alone or in combination, refers to an aromatic or heteroaromatic hydrocarbon containing at least one ring and having the specified number of carbon atoms. The term "aryl" may be construed as including a group with an aromatic or heteroaromatic ring fused to at least one cycloalkyl or heterocycloalkyl ring. The "aryl" group may include one or more heteroatom(s) independently selected from nitrogen (N), oxygen (O), P (phosphorus), and sulfur (S).

As used herein, when a definition is not otherwise provided, the term "aryloxy group" refers to "aryl-O—", wherein the term "aryl" has the same meaning as described above.

As used herein, when a definition is not otherwise provided, the term "aralkyl group" refers to a substituted or unsubstituted aryl group covalently linked to an alkyl group that is linked to a compound.

As used herein, when a definition is not otherwise provided, the term "alkylene group" refers to a straight or branched saturated aliphatic hydrocarbon group having a valence of at least two, optionally substituted with one or more substituents where indicated, provided that the valence of the alkylene group is not exceeded.

As used herein, when a definition is not otherwise provided, the term "cycloalkylene group" refers to a cyclic hydrocarbon group having a valence of at least two, optionally substituted with one or more substituents where indicated, provided that the valence of the cycloalkylene group is not exceeded.

As used herein, when a definition is not otherwise provided, the term "arylene group" refers to a functional group having a valence of at least two obtained by removal of two hydrogens in an aromatic ring, optionally substituted with one or more substituents where indicated, provided that the valence of the arylene group is not exceeded.

As used herein, when a definition is not otherwise provided, the term "aralkylene group" refers to a functional group having a valence of at least two obtained by removal of two hydrogens from the alkyl-substituted aromatic compound, optionally substituted with one or more substituents where indicated, provided that the valence of the aralkylene group is not exceeded.

As used herein, when a definition is not otherwise provided, the term "heteroarylene group" refers to a functional group having a valence of at least two obtained by removal of two hydrogens in a heteroaromatic ring, optionally substituted with one or more substituents where indicated, provided that the valence of the heteroarylene group is not exceeded.

As noted above, one way for increasing the sensitivity in EUV lithography is to increase the absorption cross-section of the resist composition at 13.5 nm. Enhancing chemically amplified resists absorption at EUV wavelength require the incorporating highly absorbing elements. The atomic absorption cross-sections at EUV of elements are known in the literature (see for example: Fallica R. et al. SPIE Advanced Lithography, 977612, 2016) and references cited therein). The elemental make up of molecules and polymers used in organic chemically amplified resists are mostly limited to carbon, hydrogen, oxygen and nitrogen. These elements have exceptionally low absorption at 13.5 nm. Fluorine atom has slightly higher absorption at 13.5 nm compared to oxygen atom. Christianson et al. explore the incorporation of fluorine atoms onto polymers backbone (see Christianson et al., SPIE Advanced Lithography 868216, 2013). The iodine atom has remarkably higher absorption cross-section at EUV. The inventors of the present application discovered iodine-containing resins and corresponding resist compositions with improved photoresist sensitivity at EUV. The sensitivity improvement was achieved by incorporating iodine atoms onto the resist resin, while extending chain of the iodine-containing monomers improved their incorporation in the resin.

An embodiment of the present disclosure provides a monomer having formula (I):

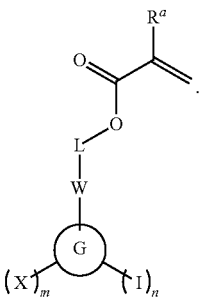

In formula (I):

W is —(C=O)O—, —O(C=O)—, —O(SO$_2$)—, —(SO$_2$)O—, —NH(SO$_2$)—, —(SO$_2$)NH—, —NH(CO)—, —(CO)NH—, —SO$_2$—, —SO—, $R^a$ may be H, F, —CN, a $C_{1-10}$ alkyl group, or a $C_{1-10}$ fluoroalkyl group;

L may be a linking group selected from an unsubstituted or substituted $C_{1-20}$ alkylene group, an unsubstituted or substituted $C_{3-20}$ cycloalkylene group, an unsubstituted or substituted $C_{6-20}$ arylene group, and an unsubstituted or substituted $C_{7-20}$ aralkylene group;

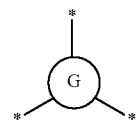

represents a monocyclic or polycyclic unsubstituted or substituted $C_{6-30}$ arylene group or a monocyclic or polycyclic unsubstituted or substituted $C_{3-30}$ heteroarylene group, wherein "*" indicates a point of attachment to a neighboring group or atom;

"I" represents iodine;

X may be selected from —F, —Cl, —Br, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group, wherein X optionally includes an ester group or —C(CF$_3$)$_2$OH;

m may be an integer of 0 or greater, provided that when m is an integer of 2 or greater, two adjacent groups X may optionally form a ring; and n may be an integer of 1 or greater.

In the above monomer, the $C_{6-30}$ arylene group may be a monocyclic $C_{6-30}$ arylene group, a fused bicyclic $C_{6-30}$ arylene group, or a singly bonded $C_{6-30}$ arylene group. The $C_{6-30}$ arylene group may be a 1,2-phenylene group, for example, a 1,2-phenylene group, a 1,3-phenylene group, and a 1,4-phenylene group. The fused bicyclic $C_{6-30}$ arylene group may be a disubstituted naphthalene group, a disubstituted anthracene group, or a disubstituted phenanthrene group. The singly bonded $C_{6-30}$ arylene group may be a disubstituted biphenylene group or a disubstituted terphenylene group. The $C_{3-30}$ heteroarylene group may be a monocyclic $C_{3-30}$ heteroarylene group, a fused bicyclic $C_{3-30}$ heteroarylene group, or a singly bonded $C_{3-30}$ heteroarylene group.

The linking group L may be an unsubstituted $C_{1-20}$ alkylene group or a $C_{1-20}$ alkylene group substituted with —F, a hydroxyl group, or a $C_{1-10}$ alkyl group.

In an embodiment, X may be a hydroxyl group. X may also be an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group. Each of these groups may optionally include an acid-cleavable group such as tertiary ester group or an acetal group.

In formula (I), the variable n represents a number of iodine atoms attached to the trivalent group

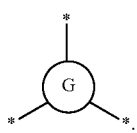

The number of iodine atoms may vary depending on the nature of this group and may be an integer of 1 or greater, for example, 1, 2, 3, 4, 5, 6, 7, 8, or 9. In an embodiment, n may be 1, 2, or 3.

Also, in formula (I), the variable m represents a number of substituents X attached to the trivalent group

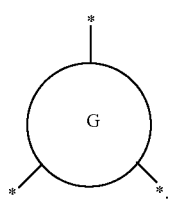

The number of substituents X may vary depending on the nature of this group and may be an integer of 1 or greater, for example, 1, 2, 3, 4, 5, 6, 7, 8, or 9. In an embodiment, m may be 1, 2, or 3. When m is an integer of 2 or greater, two adjacent groups X may optionally form a ring.

Specific examples of the monomer having formula (I) may be represented by the following chemical formulae:

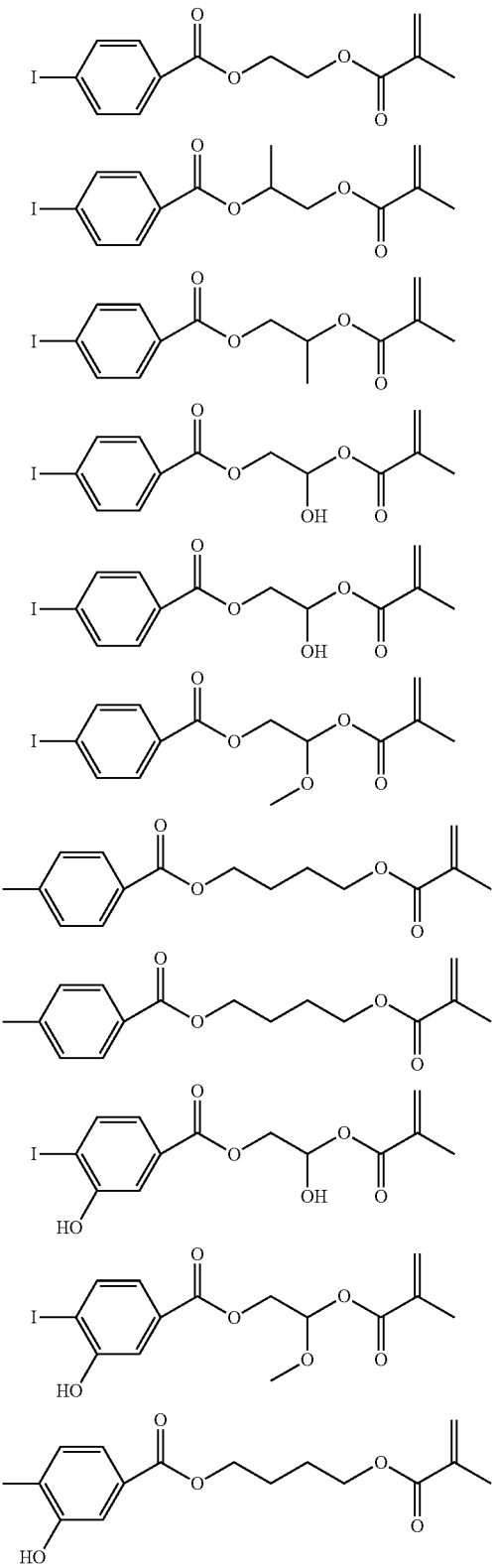

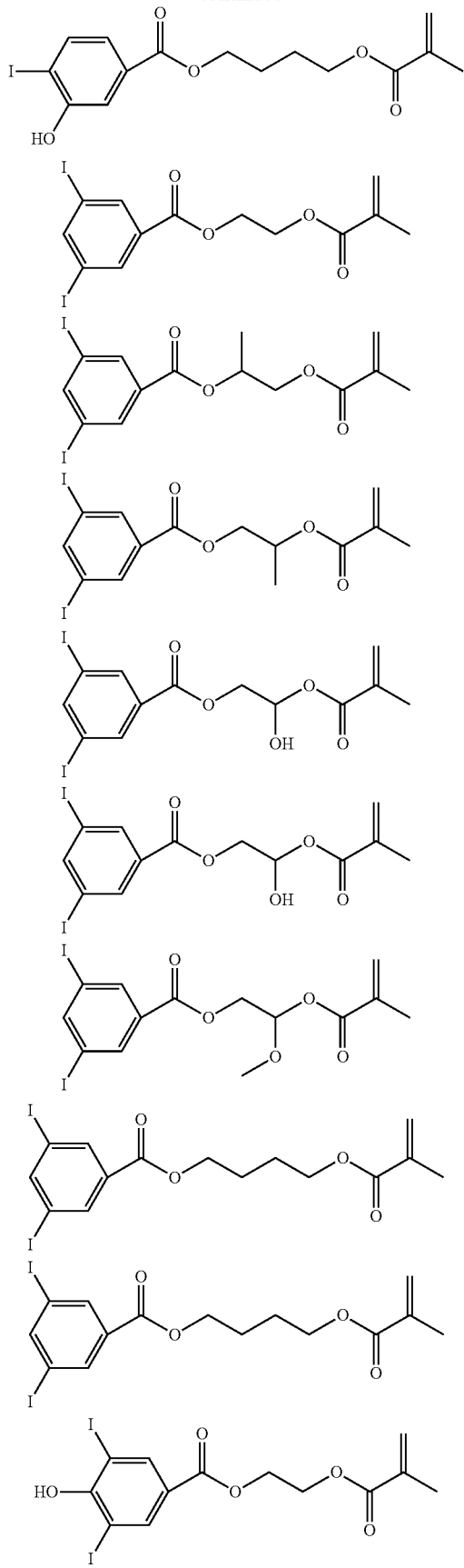
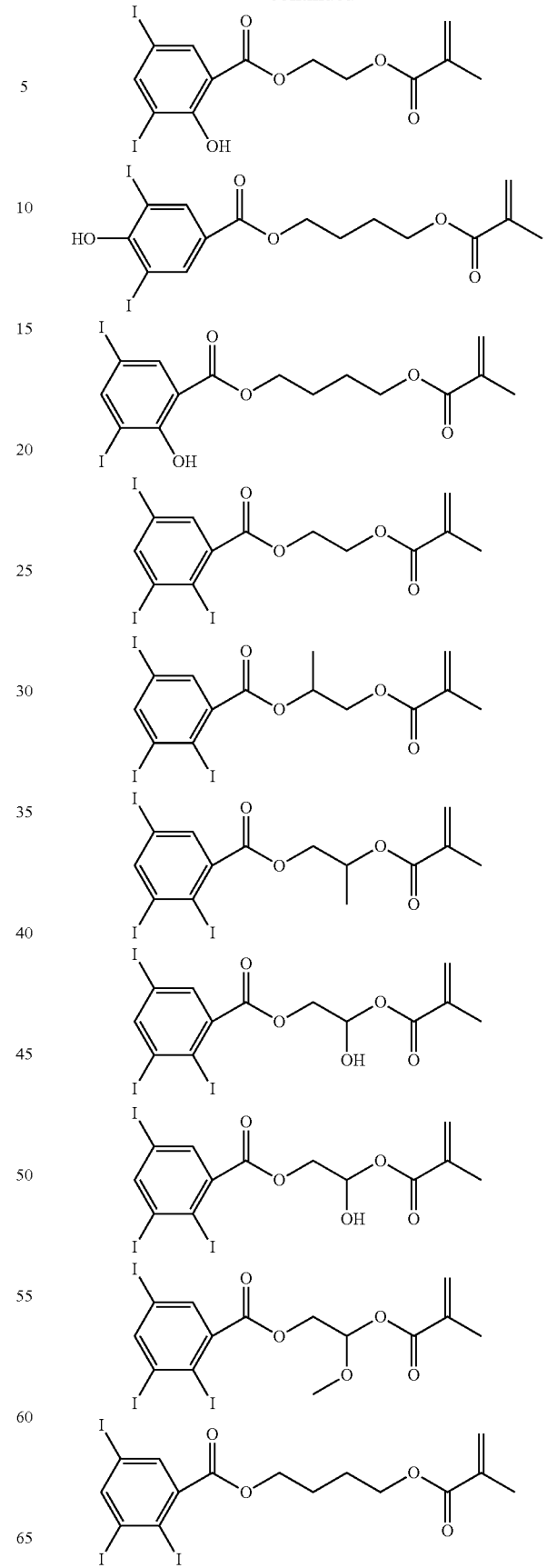

-continued

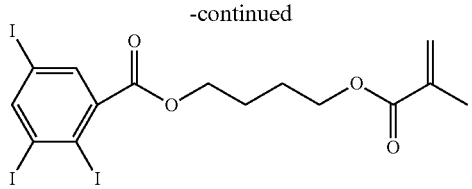

Another embodiment provides a copolymer including a polymerized product of the monomer having formula (I) and an acid-deprotectable monomer:

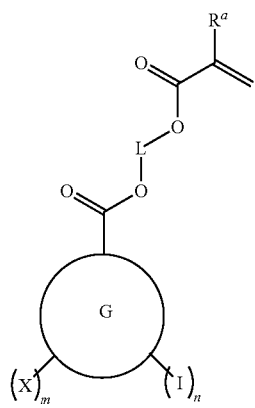
(I)

In formula (I), $R^a$, L,

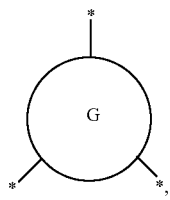

X, "I", m, and n are the same as described above.

The acid-deprotectable monomer may be represented by formula (II):

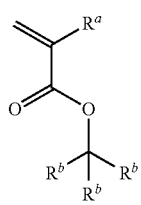
(II)

In the formula (II), $R^b$ may independently be H, an unsubstituted or substituted $C_{1-20}$ alkyl, an unsubstituted or substituted $C_{3-20}$ cycloalkyl, an unsubstituted or substituted $C_{6-20}$ aryl, or an unsubstituted or substituted $C_{7-20}$ aralkyl, and each $R^b$ may be separate or at least one $R^b$ may be bonded to an adjacent $R^b$ to form a cyclic structure. In an embodiment, the tertiary group including $R^b$ in formula (IV) may be a t-butyl group. In another embodiment, the formula (IV) may include cycloalkyl structures, which incorporate two or more $R^b$ groups, such as 1-methylcyclopentyl, 1-ethylcyclopentyl, and 1-methylcyclohexyl, and the like.

Exemplary acid deprotectable monomers of the formula (II) may include:

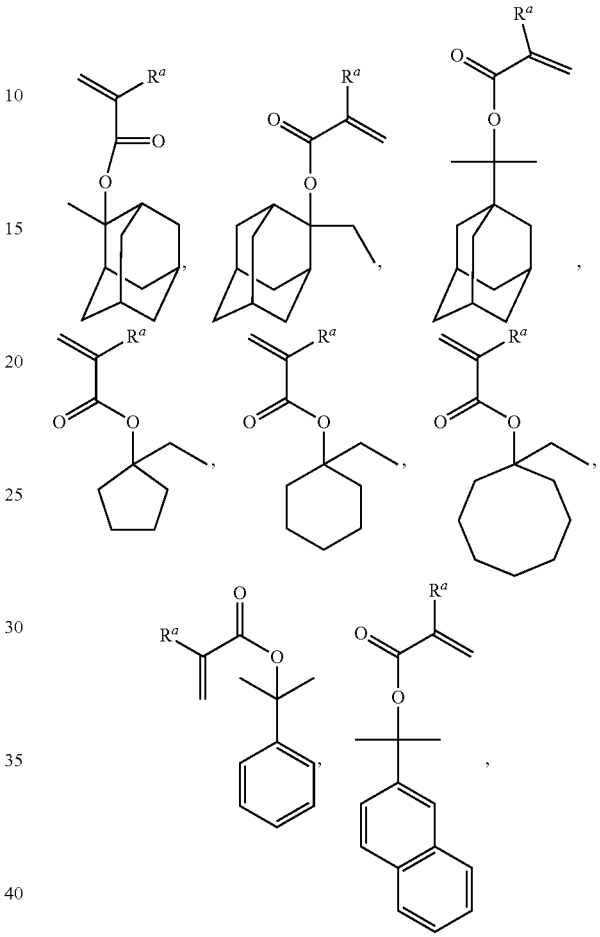

or a combination comprising at least one of the foregoing, wherein $R^a$ is H, F, $C_{1-6}$ alkyl, or $C_{1-6}$ fluoroalkyl.

The polymerized product may further include repeating units derived from a base-soluble monomer, a lactone-containing monomer, or a combination thereof.

The base-soluble monomer may be represented by formula (III):

(III)

In the formula (III), $Q_1$ may be an ester-containing or non-ester containing group selected from an unsubstituted or substituted $C_{1-20}$ alkyl, an unsubstituted or substituted $C_{3-20}$ cycloalkyl, an unsubstituted or substituted $C_{6-20}$ aryl, and an unsubstituted or substituted $C_{7-20}$ aralkyl group. In an embodiment, where an ester is included, the ester may form a connective link between $Q_1$ and the point of attachment to the double bond. In this way, where $Q_1$ is an ester group, the formula (III) may be a (meth)acrylate monomer. In another embodiment, where an ester is not included, $Q_1$ may be aromatic, so that the formula (III) may be, for example, a styrenic monomer or vinyl naphthoic monomer. $Q_1$ may be fluorinated or non-fluorinated. Further in the formula (III), a may be an integer of 1 to 3, for example, a may be 1 or 2.

Also in the formula (III), W may be a base-reactive group comprising at least one selected from —C(=O)—OH; —C(CF$_3$)$_2$OH; —NH—SO$_2$—Y$^1$ where Y$^1$ may be F or $C_{1-4}$ perfluoroalkyl; —OH; and an adduct of any of the foregoing with a vinyl ether. In an embodiment, where Q is non-aromatic (e.g., where formula (II) includes a (meth)acrylate structure having an ester linked alkyl or cycloalkyl group Q), W may be —C(CF$_3$)$_2$OH. In another embodiment, where Q is aromatic (e.g., where Q is either ester-linked or non-ester linked and is an aromatic group such as phenyl or naphthyl), W may be OH or —C(CF$_3$)$_2$OH. It is contemplated that any of the base-reactive groups may further be protected by an acid decomposable acetal leaving group (e.g., having a generic structure —O—CH(R')—O—R" where R' may be a methyl, ethyl, or other alkyl group) Such groups are adducts of a vinyl ether, such as, for example, ethyl vinyl ether, propyl vinyl ether, t-butyl vinyl ether, cyclohexylvinyl ether, the 2-vinyloxyethyl ester of 1-adamantane carboxylic acid, 2-naphthoyl ethyl vinyl ether, or other such vinyl ethers.

Exemplary base-soluble monomers having the formula (III) may include:

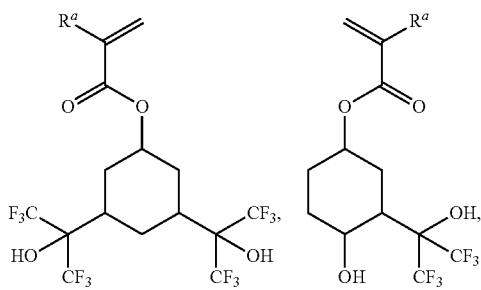

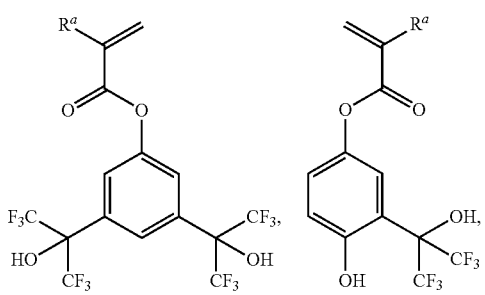

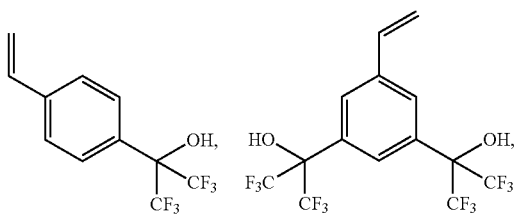

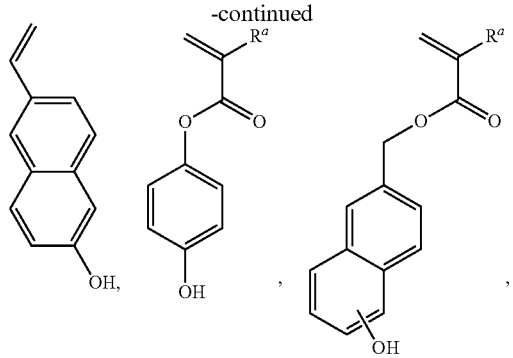

or a combination comprising at least one of the foregoing, wherein $R^a$ may be H, F, $C_{1-6}$ alkyl, or $C_{1-6}$ fluoroalkyl.

The lactone-containing monomer may be represented by formula (IV):

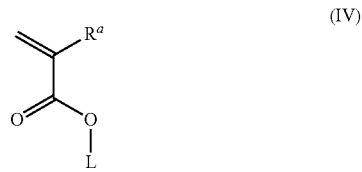

(IV)

In formula (IV), L may be a monocyclic, polycyclic, or fused polycyclic $C_{4-20}$ lactone-containing group. Such lactone groups may be included to improve both adhesion of the polymer to a substrate, and to moderate the dissolution of the polymer in a base developer. In an embodiment, L may be a monocyclic $C_{4-6}$ lactone which is attached to a (meth)acrylate moiety through a monocycle ring carbon; or L may be a $C_{6-10}$ fused polycyclic lactone based on a norbornane-type structure.

In an embodiment, a lactone-containing monomer may have formula (IVa):

(IVa)

wherein $R^a$ may be H, F, $C_{1-6}$ alkyl, or $C_{1-6}$ fluoroalkyl, R is a $C_{1-10}$ alkyl, cycloalkyl, or heterocycloalkyl, and w may be an integer of 0 to 6.

It will be appreciated in formula (IVa) that R may be separate or may be attached to the lactone ring and/or one or more R groups, and that the methacrylate moiety may be attached to the lactone ring directly, or indirectly through R.

Exemplary lactone-containing monomers of formulae (IV) and (IVa) may include:

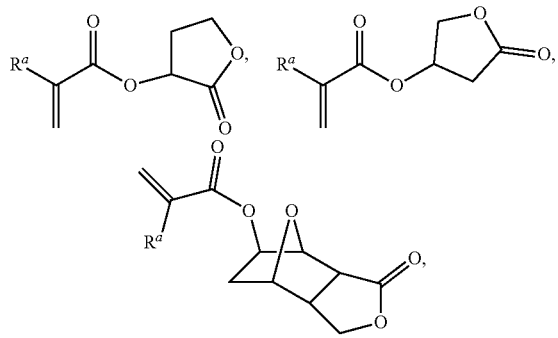
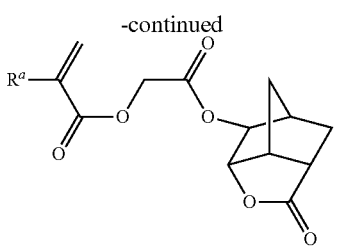
or a combination including at least one of the foregoing, wherein $R^a$ may be H, F, $C_{1-6}$ alkyl, or $C_{1-6}$ fluoroalkyl.
In an embodiment, the copolymer may include a polymerized product having the following structure:
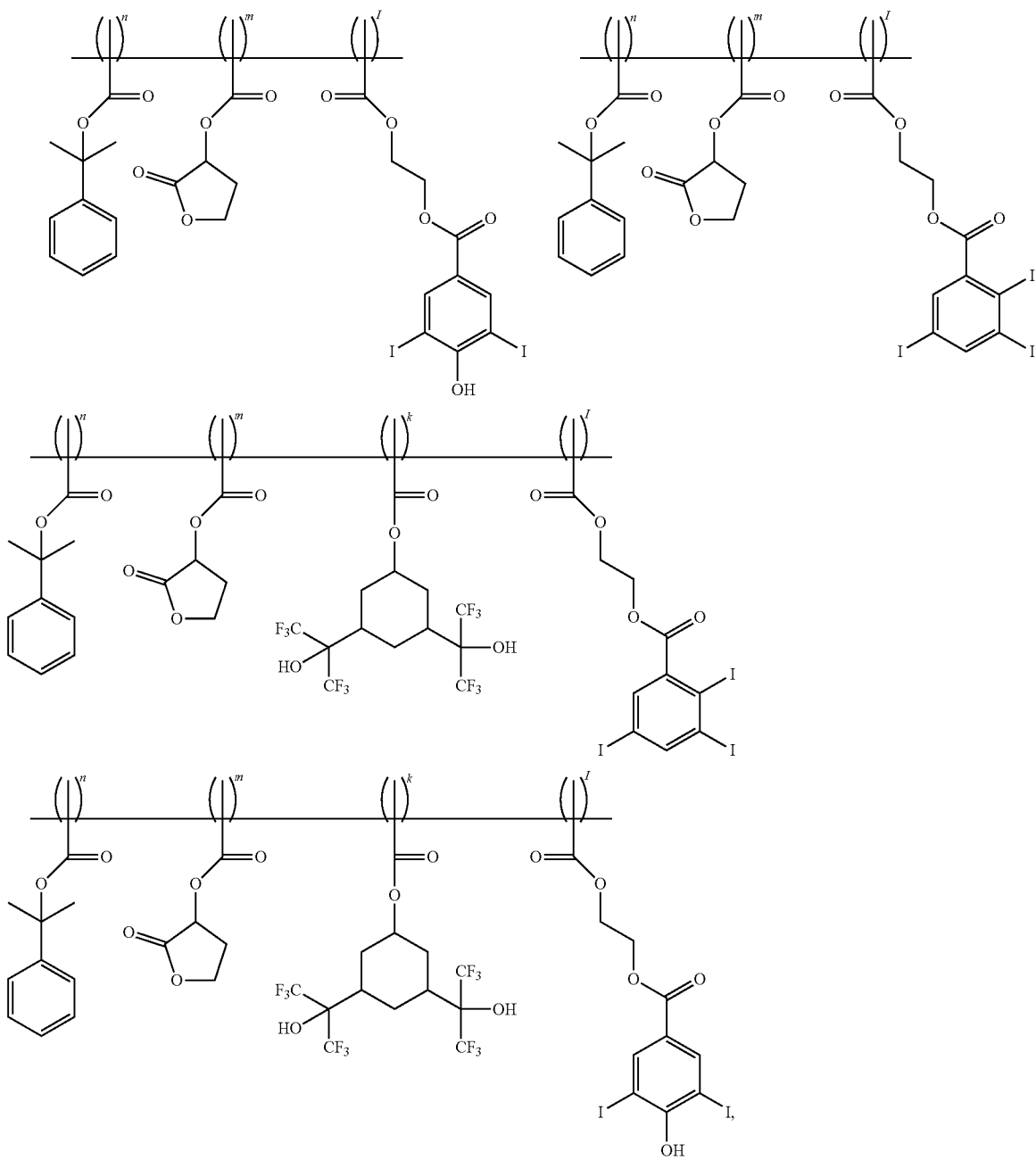

wherein k, l, m, and n represent mole fractions of the corresponding repeating units, and "I" is iodine.

Another embodiment further provides a photoresist composition including the above copolymer and a non-polymerizable photoacid generator having formula $G^+A^-$, wherein $A^-$ is a non-polymerizable organic anion and $G^+$ has formula (VI):

In formula (VI),

X may be S or I, each $R^c$ may be halogenated or non-halogenated, and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and z is 2 or 3, and wherein when X is I, z is 2, or when X is S, z is 3.

For example, cation $G^+$ may have formula (VII), (VIII), or (IX):

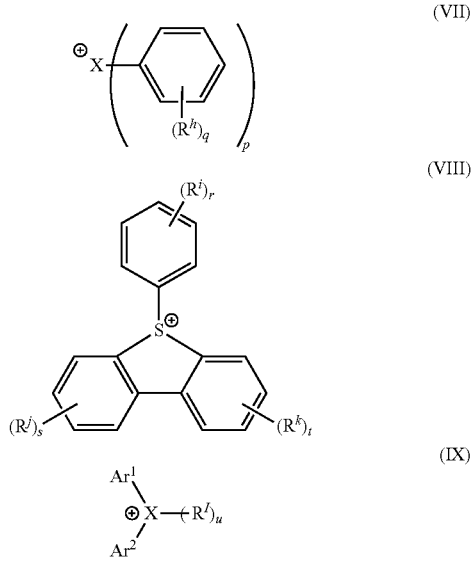

wherein

X is I or S, $R^h$, $R^i$, $R^j$, and $R^k$ are unsubstituted or substituted and are each independently hydroxy, nitrile, halogen, $C_{1-30}$ alkyl, $C_{1-30}$ fluoroalkyl, $C_{3-30}$ cycloalkyl, $C_{1-30}$ fluorocycloalkyl, $C_{1-30}$ alkoxy, $C_{3-30}$ alkoxycarbonylalkyl, $C_{3-30}$ alkoxycarbonylalkoxy, $C_{3-30}$ cycloalkyl, $C_{5-30}$ cycloalkoxycarbonylalkyl, $C_{5-30}$ cycloalkoxycarbonylalkoxy, $C_{1-30}$ fluoroalkoxy, $C_{3-30}$ fluoroalkoxycarbonylalkyl, $C_{3-30}$ fluoroalkoxycarbonylalkoxy, $C_{3-30}$ fluorocycloalkoxy, $C_{5-30}$ fluorocycloalkoxycarbonylalkyl, $C_{5-30}$ fluorocycloalkoxycarbonylalkoxy, $C_{6-30}$ aryl, $C_{6-30}$ fluoroaryl, $C_{6-30}$ aryloxy, or $C_{6-30}$ fluoroaryloxy, each of which is unsubstituted or substituted;

$Ar^1$ and $Ar^2$ are independently $C_{10-30}$ fused or singly bonded polycyclic aryl groups;

wherein X is S or I;

p is an integer of 2 or 3, wherein when X is I, p is 2, and wherein when X is S, p is 3, q and r are each independently an integer from 0 to 5, u is an integer from 0 to 1, wherein when u is 0, X is I, and wherein when u is 1, X is S, and s and t are each independently an integer from 0 to 4.

In formulae (VII), (VIII), or (IX), at least one of $R^h$, $R^i$, $R^j$, and $R^k$ may be an acid-cleavable group. In an embodiment, the acid-cleavable group may be (i) a tertiary $C_{1-30}$ alkoxy (for example, a tert-butoxy group), a tertiary $C_{3-30}$ cycloalkoxy group, a tertiary $C_{1-30}$ fluoroalkoxy group, (ii) a tertiary $C_{3-30}$ alkoxycarbonylalkyl group, a tertiary $C_{5-30}$ cycloalkoxycarbonylalkyl group, a tertiary $C_{3-30}$ fluoroalkoxycarbonylalkyl group, (iii) a tertiary $C_{3-30}$ alkoxycarbonylalkoxy group, a tertiary $C_{5-30}$ cycloalkoxycarbonylalkoxy group, a tertiary $C_{3-30}$ fluoroalkoxycarbonylalkoxy group, or (iv) a $C_{2-30}$ acetal group including moiety —O—C($R^{11}R^{12}$)—O— (wherein $R^{11}R^{12}$ are each independently hydrogen or a $C_{1-30}$ alkyl group).

The photoresist composition including the copolymer and the non-polymerizable photoacid generator as disclosed herein may be used to provide a layer including the photoresist. A coated substrate may be formed from the photoresist composition. Such a coated substrate includes: (a) a substrate having one or more layers to be patterned on a surface thereof; and (b) a layer of the photoresist composition over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layers on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying (casting) a layer of the above photoresist composition on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispensing, the wafer may be spun at a speed of up to 4,000 rpm, preferably from about 200 to 3,000 rpm, and more preferably 1,000 to 2,500 rpm. The coated wafer is spun to remove solvent, and baked on a hot plate to remove residual solvent and free volume from the film to make it uniformly dense.

The casting solvent can be any suitable solvent known to one of ordinary skill in the art. For example, the casting solvent can be an aliphatic hydrocarbon (such as hexane, heptane, and the like), an aromatic hydrocarbon (such as toluene, xylene, and the like), a halogenated hydrocarbon (such as dichloromethane, 1,2-dichloroethane, 1-chlorohexane, and the like), an alcohol (such as methanol, ethanol, 1-propanol, iso-propanol, tert-butanol, 2-methyl-2-butanol, 4-methyl-2-pentanol, and the like), water, an ether (such as diethyl ether, tetrahydrofuran, 1,4-dioxane, anisole, and the like), a ketone (such as acetone, methyl ethyl ketone, methyl isobutyl ketone, 2-heptanone, cyclohexanone, and the like), an ester (such as ethyl acetate, n-butyl acetate, propylene glycol monomethyl ether acetate ("PGMEA"), ethyl lactate, ethyl acetoacetate, and the like), a lactone (such as γ-butyrolactone, ε-caprolactone, and the like), a nitrile (such as acetonitrile, propionitrile, and the like), an aprotic bipolar solvent (such as dimethylsulfoxide, dimethylformamide, and the like), or a combination thereof. The choice of the casting solvent depends on a particular photoresist composition and can be readily made by one of ordinary skill in the art based on knowledge and experience.

Pattern-wise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including EUV or e-beam radiation. It will be appreciated that exposure using the activating radiation decomposes the PAG in the exposed areas and generates acid and decomposition by-products, and that the acid or the by-products then effectuates a chemical change in the polymer and nanoparticles (deblocking the acid sensitive group to generate a base-soluble group, or alternatively, catalyzing a crosslinking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is a positive tone) or removing the unexposed portions of the film (where the photoresist is crosslinkable in the exposed regions, i.e., a negative tone). Preferably, the photoresist is a negative tone, based on a polymer having pendant and/or free acid groups or by-products (derived from bound or free PAG following irradiation) that inhibit the dissolution of the nanoparticles, and the developer is preferably solvent based. A pattern forms by developing. The solvent developer can be any suitable developer known in the art. For example, the solvent developer can be an aliphatic hydrocarbon (such as hexane, heptane, and the like), an aromatic hydrocarbon (such as toluene, xylene, and the like), a halogenated hydrocarbon (such as dichloromethane, 1,2-dichloroethane, 1-chlorohexane, and the like), an alcohol (such as methanol, ethanol, 1-propanol, iso-propanol, tert-butanol, 2-methyl-2-butanol, 4-methyl-2-pentanol, and the like), water, an ether (such as diethyl ether, tetrahydrofuran, 1,4-dioxane, anisole, and the like), a ketone (such as acetone, methyl ethyl ketone, methyl isobutyl ketone, 2-heptanone, cyclohexanone, and the like), an ester (such as ethyl acetate, n-butyl acetate, propylene glycol monomethyl ether acetate ("PGMEA"), ethyl lactate, ethyl acetoacetate, and the like), a lactone (such as γ-butyrolactone, ε-caprolactone, and the like), a nitrile (such as acetonitrile, propionitrile, and the like), an aprotic bipolar solvent (such as dimethylsulfoxide, dimethylformamide, and the like), or a combination thereof. In an embodiment, the solvent developer may be a miscible mixture of solvents, for example, a mixture of an alcohol (iso-propanol) and ketone (acetone). The choice of the developer solvent depends on a particular photoresist composition and can be readily made by one of ordinary skill in the art based on knowledge and experience.

The photoresist may, when used in one or more such pattern-forming processes, be used to fabricate electronic and optoelectronic devices such as memory devices, processor chips (CPUs), graphics chips, and other such devices.

The polymerized product may further include a repeating unit derived from a monomer comprising a photoacid generator.

The photoacid generator including a polymerizable group may be represented by formula (V):

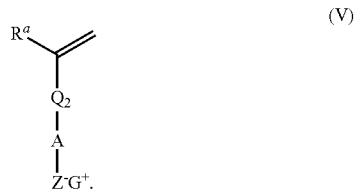

In formula (V), each $R^a$ may independently be H, F, $C_{1-10}$ alkyl, or $C_{1-10}$ fluoroalkyl. As used throughout this specification, "fluoro" or "fluorinated" means that one or more fluorine groups are attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms; similarly, "fluoroaryl" means monofluoroaryl, perfluoroaryl, etc. "Substantially all" in this context means greater than or equal to 90%, preferably greater than or equal to 95%, and still more preferably greater than or equal to 98% of all atoms attached to carbon are fluorine atoms.

In formula (V), $Q_2$ may be a single bond or an ester-containing or non-ester containing, fluorinated or non-fluorinated group selected from $C_{1-20}$ alkyl, $C_{3-20}$ cycloalkyl, $C_{6-20}$ aryl, and $C_{7-20}$ aralkyl. For example, where an ester is included, the ester may form a connective link between $Q_2$ and the point of attachment to the double bond. In this way, where $Q_2$ is an ester group, formula (V) may be a (meth) acrylate monomer. Where an ester is not included, $Q_2$ may be aromatic, so that formula (V) may be, for example, a styrenic monomer or vinyl naphthoic monomer.

Also, in formula (V), A may be an ester-containing or non ester-containing, fluorinated or non-fluorinated group selected from $C_{1-20}$ alkyl, $C_{3-20}$ cycloalkyl, $C_{6-20}$ aryl, or $C_{7-20}$ aralkyl. Useful A groups may include fluorinated aromatic moieties, straight chain fluoroalkyl, or branched fluoroalkyl esters. For example, A may be a —[(C($R^e$)$_2$)$_x$(=O)O]$_c$—(C($R^f$)$_2$)$_y$(CF$_2$)$_z$— group, or an o-, m- or p-substituted —C$_6$R$^g_4$— group, where each $R^e$, $R^f$, and $R^g$ are each independently H, F, $C_{1-6}$ fluoroalkyl, or $C_{1-6}$ alkyl, c may be 0 or 1, x may be an integer of 1 to 10, y and z may independently be integers of from 0 to 10, and the sum of y+z may be at least 1.

Also, in formula (V), $Z^-$ may be an anionic group including a sulfonate (—SO$_3^-$), the anion of a sulfonamide (—SO$_2$(N$^-$)R' where R' may be a $C_{1-10}$ alkyl or $C_{6-20}$ aryl, or the anion of a sulfonimide. Where $Z^-$ is a sulfonimide, the sulfonimide may be an asymmetric sulfonimide having the general structure A-SO$_2$—(N$^-$)—SO$_2$—$Y^2$, where A is as described above, and $Y^2$ may be a straight chain or branched $C_{1-10}$ fluoroalkyl group. For example, the $Y^2$ group may be a $C_{1-4}$ perfluoroalkyl group, which may be derived from the corresponding perfluorinated alkanesulfonic acid, such as trifluoromethanesulfonic acid or perfluorobutanesulfonic acid.

In an embodiment, the monomer of formula (V) may have the structure of formula (Va) or (Vb):

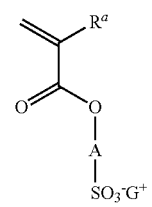

21
-continued
(Vb)
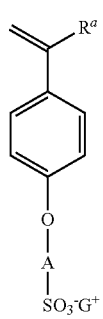
wherein A and $R^a$ are as defined for formula (V).
22
In formulae (V), (Va), and (Vb), $G^+$ may have formula (VI):
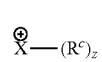  (VI)
wherein X, $R^c$, and z are the same as described in the embodiments above.
In an embodiment, the copolymer may include a polymerized product having any of the following structures:
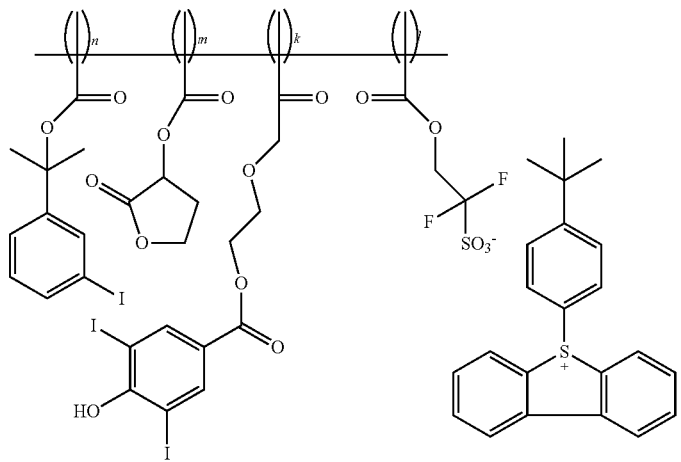
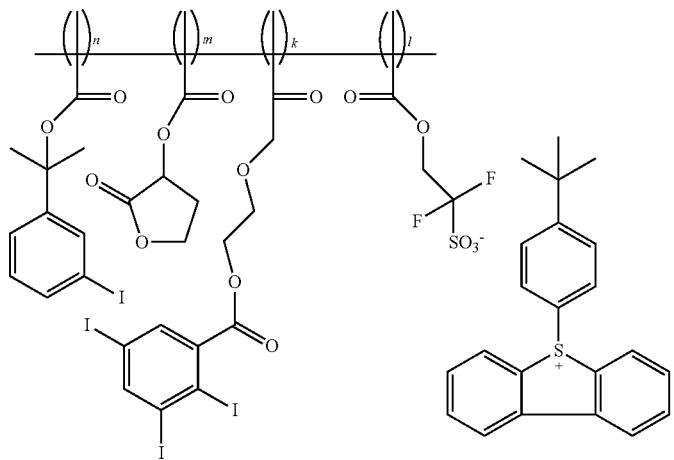

-continued

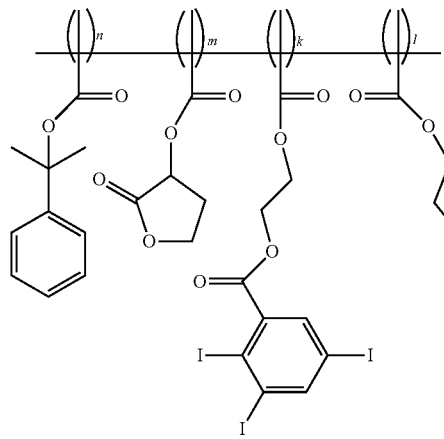 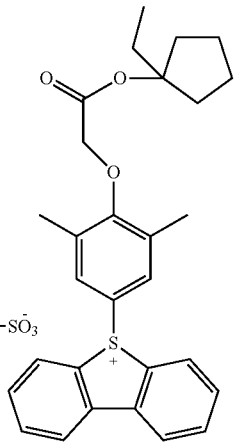

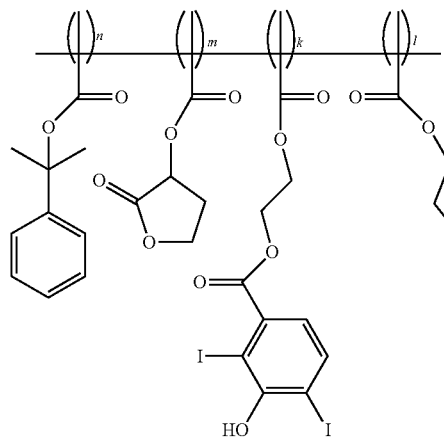 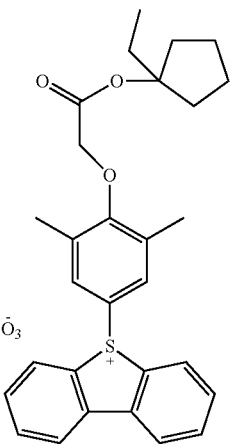

wherein k, l, m, and n represent mole fractions of the corresponding repeating units, and "I" is iodine.

Another embodiment provides a photoresist composition including the above copolymer and a coated substrate including: (a) a substrate having one or more layers to be patterned on a surface thereof; and (b) a layer of the above photoresist composition over the one or more layers to be patterned.

Yet another embodiment provides a method of forming an electronic device, including:

(a) applying a layer of the above photoresist composition on a surface of the substrate;

(b) pattern-wise exposing the photoresist composition layer to activating radiation; and (c) developing the exposed photoresist composition layer to provide a resist relief image.

Hereinafter, the present disclosure is illustrated in more detail with reference to examples. However, these examples are exemplary, and the present disclosure is not limited thereto.

EXAMPLES

The acronyms and chemical structures of monomers used in these examples are presented in Table 1. TIPEMA monomer was prepared according to literature procedure (*Biomacromolecules*, 4(3), 793-798; 2003). PPMA monomer was purchased from ENF Co., Ltd. and DiHFA monomer was purchased from Central Glass Co., Ltd. The synthesis of the monomer ECPPDBT ADMA-TFPS is described in U.S. patent application Ser. No. 15/131,135 filed on Apr. 18, 2016.

TABLE 1

| Monomer Acronym | Chemical Structure |
|---|---|
| PPMA | 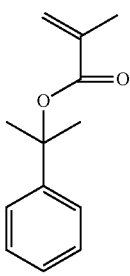 |
| α-GBLMA | 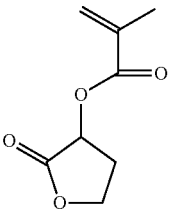 |
| DiHFA | 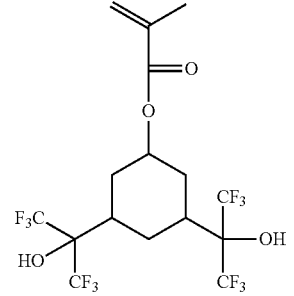 [SMILES: C=C(C)C(=O)OC1CC(C(O)(C(F)(F)F)C(F)(F)F)CC(C(O)(C(F)(F)F)C(F)(F)F)C1] |
| TIPEMA | 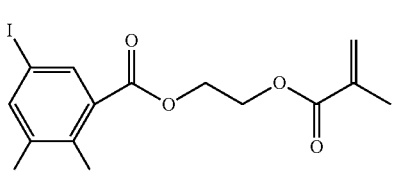 |
| ECPPDBT ADMA-TFPS | 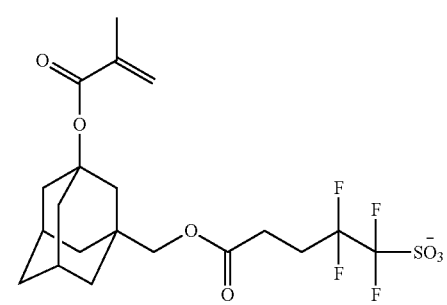 |

TABLE 1-continued

| Monomer Acronym | Chemical Structure |
|---|---|
| | 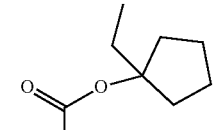 |

Copolymer Synthesis

This example describes the synthesis of three inventive and one comparative copolymers. Table 2 collates monomers and corresponding molar ratios used in the synthesis of each polymer.

Copolymer 1 was prepared from the monomers PPMA, α-GBLMA, TIPEMA, at a molar feed ratio of 39/49/12. A feed solution was made by dissolving PPMA (5.52 g, 27.0 mmol), α-GBLMA (6.03 g, 35.0 mmol) and TIPEMA (4.31 g, 7.8 mmol) in 16.38 g anisole. An initiator solution was prepared by dissolving 2.10 g of the azo initiator dimethyl 2,2'-azobis(2-methylpropionate) (obtained as V-601 from Wako Pure Chemical Industries, Ltd.) in 12.63 g of anisole. The polymerization was carried out in a 3-neck round bottom flask fitted with a water condenser and a thermometer to monitor the reaction in the flask. The reactor was charged with PPMA (0.47 g, 1.42 mmol), α-GBLMA (0.30 g, 2.0 mmol), TIPEMA (0.68 g, 1.0 mmol) and in 17.50 g of anisole, and the contents were heated to 80° C. The feed solution and the initiator solution were fed into the reactor using syringe pumps over a 4 h time period. The contents were then stirred for an additional 2 h. The contents were cooled to room temperature, diluted with tetrahydrofuran ("THF") to 25 weight percent, and precipitated into 10-fold (by weight) of methanol. The resulting copolymer 1 was isolated by filtration and dried under vacuum at 50° C. for 24 h.

Copolymer 2 was prepared from the monomers PPMA, α-GBLMA, DiHFA, TIPEMA, at a molar feed ratio of 35/45/10/10. A monomer solution was made by dissolving PPMA (4.41 g, 22.0 mmol), α-GBLMA (4.73 g, 28 mmol), DiHFA (3.09 g, 6.0 mmol) and TIPEMA (3.78 g, 6.00 mmol in 17.5 g acetonitrile and 8.8 g tetrahydrofuran. The polymerization was carried out in a 3-neck round bottom flask fitted with a water condenser and a thermometer to monitor the reaction in the flask. The flask was charged with 8.5 g of the monomer solution and heated to 70° C. To the rest of the monomer solution was added 1.53 g initiator 2,2'-azobis (2.4-dimethyl valeronitrile) (obtained as V-65 from Wako Pure Chemical Industries, Ltd.) and the mixture was fed to the reaction flask using syringe pumps over a 4 h time period while keeping the temperature at 70° C. The polymerization mixture was then stirred for an additional 2 h at the same temperature. The contents were cooled to room temperature, and precipitated into 10-fold (by weight) of methyl tert-butyl ether. The resulting Copolymer 2 was isolated by filtration and dried under vacuum at 50° C. for 24 h.

Copolymer 3 was prepared using the similar procedure used to make Copolymer 2, except using the monomer types and molar feed ratios as specified in Table 2.

Comparative Copolymer 4 was prepared using the similar procedure used to make Copolymer 1, except using the monomer types and molar feed ratios as specified in Table 2.

TABLE 2

| Copolymer | Unit 1 (mole %) | Unit 2 (mole %) | Unit 3 (mole %) | Unit 4 (mole %) |
|---|---|---|---|---|
| 1 | PPMA (39.0) | α-GBLMA (49.0) | TIPEMA (12.0) | |
| 2 | PPMA (35) | α-GBLMA (48) | TIPEMA (10) | DiHFA (10) |
| 3 | PPMA (35.0) | α-GBLMA (45.0) | TIPEMA (15) | ECPPDBT ADMA-TFPS (5.0) |
| 4 (comparative) | PPMA (38.5) | α-GBLMA (49.5) | DiHFA (12) | |

Photoresist Preparation and Processing

Photoresist compositions containing Copolymers 1 and Comparative Polymer 4 were each independently formulated as summarized in Table 3. Component amounts in Table 3 are based on total solids, excluding solvents. The non-polymeric photoacid generators were ECPPDBT AdOH-TFBS, which has the chemical structure:

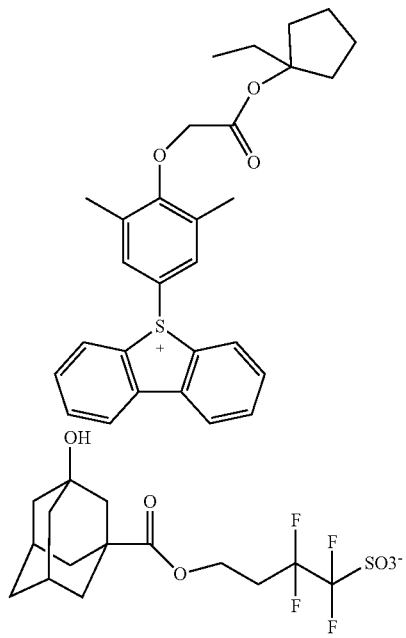

The quencher was trioctylamine (TOA). The surfactant was a fluorinated surfactant obtained as POLYFOX™ PF-656.

TABLE 3

| Photoresist | Copolymer | PAG | Quencher | Surfactant |
|---|---|---|---|---|
| 1 | 47% Copolymer 1 | 47% ECPPDBT AdOH-TFBS | 4% | 0.1% |

TABLE 3-continued

| Photoresist | Copolymer | PAG | Quencher | Surfactant |
|---|---|---|---|---|
| Comparative 2 | 47% Copolymer 4 | 47% ECPPDBT AdOH-TFBS | 4% | 0.1% |

Photoresist compositions containing Copolymers 1 and Comparative Polymer 4 were each independently formulated as summarized in Table 4. Component amounts in Table 4 are based on total solids, excluding solvents. The quencher and the surfactant were the same as in Photoresist 1 and 2. The non-polymeric photoacid generators was DTBPI PFBuS which has the chemical structure:

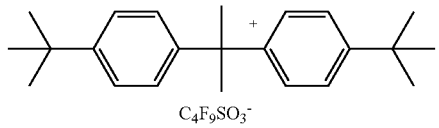

Compositions of the inventive and comparative photoresist compositions are summarized in Table 4, where component amounts are expressed as weight percent based on total solids, excluding solvents.

TABLE 4

| Photoresist | Copolymer | PAG | Quencher | Surfactant |
|---|---|---|---|---|
| 3 | 37.6% Copolymer 1 | 58.4% DTBPI PFBuS | 4% | 0.1% |
| Comparative 4 | 37.6% Copolymer 4 | 58.4% DTBPI PFBuS | 4% | 0.1% |

All formulations in Table 3 and Table 4 used a propylene glycol monomethyl ether acetate as a solvent. The resists were processed at a soft bake of 110° C. for 90 seconds and a post-exposure base at 100° C. for 60 seconds. Contrast curves at 248 nanometers were generated by coating the resist on a thick organic antireflective layer. The resist was exposed at 248 nanometers on a Canon TELACT tool. After a post-exposure bake, the resists were developed for 60 seconds using 0.26 N tetramethylammonium hydroxide solution. Film thickness values were measured using KLA Tencore OPTIPROBE™ 7341 thermal wave tool. Results from this evaluation are presented in Table 5, where "248 nm $E_0$" is the 248 nanometer exposure dose to clear, expressed in millijoules/centimeter$^2$.

Contrast curve measurements with EUV exposure source (13.5 nm) were obtained using a LithoTech Japan EUVES-9000 flood exposure tool. The resist was spin coated onto either an organic underlayer or a silicon wafer and baked at 110° C. for 90 seconds to form a 40-50 nm thick photoresist film. The resist was exposed to an increasing dose of 13.5 nm radiation in a step-wise manner, post-exposure baked at 100° C. for 60 seconds, and developed with 0.26 N aqueous tetramethylammonium hydroxide solution for 60 seconds to form a relief image pattern of exposed and non-exposed areas. Thickness was measured at each exposed area using a KLA Thermawave-7 ellipsometer and plotted vs. dose. Dose-to-clear values ($E_0$) were calculated at 10% or less remaining film thickness. Results from this evaluation are presented in Table 5, where "EUV E" is the 13.5 nanometer exposure dose to clear, expressed in millijoules/centimeter$^2$. As can be seen, Photoresist 1 which contain terpolymer with iodo-containing TIPEMA repeat units has higher photospeed under EUV exposure compared to the comparative Photoresist 2 which comprises iodine-free terpolymer. The photospeed advantage was further verified by using different photoacid generator, thus, Photoresist 3 which contain terpolymer with iodo-containing TIPEMA has faster EUV photospeed compared to Photoresist 4 which comprises iodine-free polymer.

TABLE 5

| Photoresist | 248 nm $E_0$ (mJ/cm$^2$) | EUV $E_0$ (mJ/cm$^2$) |
|---|---|---|
| 1 | 6.0 | 1.1 |
| 2 (comparative) | 7.2 | 2.1 |
| 3 | 4.0 | 0.7 |
| 4 (comparative) | 2.8 | 0.9 |

Photoresist compositions containing inventive Copolymers 2 and 3 were each independently formulated as summarized in Table 6. Contrast curve measurements with EUV exposure source (13.5 nm) were obtained using a LithoTech Japan EUVES-9000 flood exposure tool. The resist was spin coated onto either an organic underlayer or a silicon wafer and baked at 110° C. for 90 seconds to form a 40-50 nm thick photoresist film. The resist was exposed to an increasing dose of 13.5 nm radiation in a step-wise manner, post-exposure baked at 100° C. for 60 seconds, and developed with 0.26 N aqueous tetramethylammonium hydroxide solution for 60 seconds to form a relief image pattern of exposed and non-exposed areas. Thickness was measured at each exposed area using a KLA Thermawave-7 ellipsometer and plotted vs. dose. Dose-to-clear values ($E_0$) were calculated at 10% or less remaining film thickness. Results from this evaluation are presented in Table 6, where "EUV E" is the 13.5 nanometer exposure dose to clear, expressed in millijoules/centimeter$^2$. Photoresist Compositions 5 (which comprises an iodine-containing tetrapolymer) and Photoresist Composition 6 (which comprises iodine-containing polymer-bound photoacid generator) show outstanding sensitivity at EUV exposure, demonstrating the wide scope and utility of iodo-containing polymers in lithographic patterning.

TABLE 6

| Photoresist | Copolymer | PAG | Quencher | Surfactant | EUV $E_0$ (mJ/cm$^2$) |
|---|---|---|---|---|---|
| 5 | 47% Copolymer 2 | 49% ECPPDBT AdOH-TFBS | 0.75% | 0.1% | 1.2 |
| 6 | 47% Copolymer 3 | 49% ECPPDBT AdOH-TFBS | 0.75% | 0.1% | 1.2 |

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A monomer having formula (I):

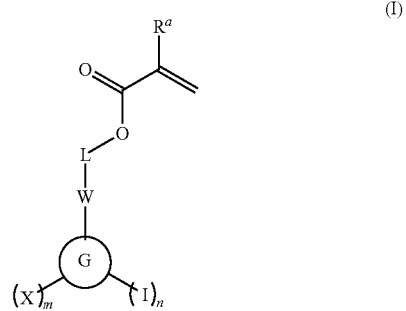

wherein in formula (I):

W is —(C=O)O—, —O(C=O)—, —O(SO$_2$)—, —(SO$_2$)O—, —NH(SO$_2$)—, —(SO$_2$)NH—, —NH(CO)—, —(CO)NH—, —SO$_2$—, —SO—, $R^a$ is H, F, —CN, a $C_{1-10}$ alkyl group, or a $C_{1-10}$ fluoroalkyl group;

L is a linking group selected from an unsubstituted or substituted $C_{1-20}$ alkylene group, an unsubstituted or substituted $C_{3-20}$ cycloalkylene group, an unsubstituted or substituted $C_{6-20}$ arylene group, and an unsubstituted or substituted $C_{7-20}$ aralkylene group;

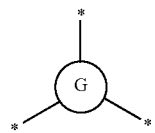

represents a monocyclic or polycyclic unsubstituted or substituted $C_{6-30}$ arylene group or a monocyclic or polycyclic unsubstituted or substituted $C_{3-30}$ heteroarylene group, wherein "*" indicates a point of attachment to a neighboring group or atom;

"I" represents iodine;

X is selected from —F, —Cl, —Br, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group, wherein at least one X comprises an ester group or —C(CF$_3$)$_2$OH;

m is an integer of 1 or greater, provided that when m is an integer of 2 or greater, two adjacent groups X optionally form a ring;
n is an integer of 1 or greater.
2. The monomer of claim 1, wherein
L is a $C_{1-20}$ alkylene group substituted with —F, a hydroxyl group, or a $C_{1-10}$ alkyl group; and
n is 1, 2, or 3.
3. A copolymer comprising a polymerized product of a monomer having formula (I) and a photoacid generator having formula (V):

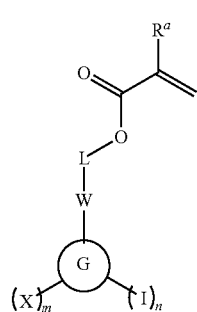
(I)

wherein in formula (I):
W is —(C=O)O—, —O(C=O)—, —O(SO$_2$)—, —(SO$_2$)O—, —NH(SO$_2$)—, —(SO$_2$)NH—, —NH (CO)—, —(CO)NH—, —SO$_2$—, —SO—,
$R^a$ is H, F, —CN, a $C_{1-10}$ alkyl group, or a $C_{1-10}$ fluoroalkyl group;
L is a linking group selected from an unsubstituted or substituted $C_{1-20}$ alkylene group, an unsubstituted or substituted $C_{3-20}$ cycloalkylene group, an unsubstituted or substituted $C_{6-20}$ arylene group, and an unsubstituted or substituted $C_{7-20}$ aralkylene group;

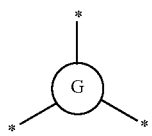

represents a monocyclic or polycyclic unsubstituted or substituted $C_{6-30}$ arylene group or a monocyclic or polycyclic unsubstituted or substituted $C_{3-30}$ heteroarylene group, wherein "*" indicates a point of attachment to a neighboring group or atom;
"I" represents iodine;
X is selected from —F, —Cl, —Br, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, an unsubstituted or substituted $C_{1-30}$ alkyl group, an unsubstituted or substituted $C_{2-30}$ alkenyl group, an unsubstituted or substituted $C_{2-30}$ alkynyl group, an unsubstituted or substituted $C_{1-30}$ alkoxy group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group,
wherein X optionally comprises an ester group or —C(CF$_3$)$_2$OH;
m is an integer of 0 or greater, provided that when m is an integer of 2 or greater, two adjacent groups X optionally form a ring; and
n is an integer of 1 or greater, provided that when m is 0, n is 3 or greater,

(V)

wherein in Formula (V):
$R^a$ is independently H, F, $C_{1-10}$ alkyl, or $C_{1-10}$ fluoroalkyl;
$Q_2$ is a single bond or an ester-containing or non-ester containing, fluorinated or non-fluorinated group selected from a $C_{1-20}$ alkylene group, a $C_{3-20}$ cycloalkylene group, a $C_{6-20}$ arylene group, and a $C_{7-20}$ aralkylene group;
A is an ester-containing or non ester-containing, fluorinated or non-fluorinated group selected from a $C_{1-20}$ alkylene group, a $C_{3-20}$ cycloalkylene group, a $C_{6-20}$ arylene group, and a $C_{7-20}$ aralkylene group;
Z is an anionic moiety comprising sulfonate, an anion of a sulfonamide, or an anion of a sulfonimide; and
$G^+$ has formula (VII), (VIII), or (IX):

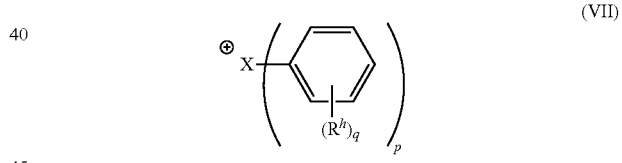
(VII)

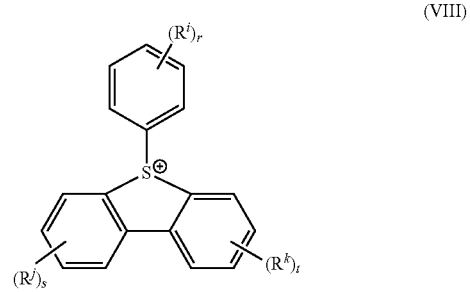
(VIII)

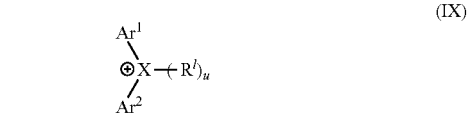
(IX)

wherein
X is I or S,
$R^h$, $R^i$, $R^j$, and $R^k$ are unsubstituted or substituted and are each independently hydroxy, nitrile, halogen, a $C_{1-30}$ alkyl group, a $C_{1-30}$ fluoroalkyl group, a $C_{3-30}$ cycloalkyl group, a $C_{1-30}$ fluorocycloalkyl group, a $C_{1-30}$ alkoxy group, a $C_{3-30}$ alkoxycarbonylalkyl group, a $C_{3-30}$ alkoxycarbonylalkoxy group, a $C_{3-30}$ cycloalkoxy group, $C_{5-30}$ a cycloalkoxycarbonylalkyl group, a $C_{5-30}$ cycloalkoxycarbonylalkoxy group, a $C_{1-30}$ fluoroalkoxy group, a $C_{3-30}$ fluoroalkoxycarbonylalkyl group, a $C_{3-30}$ fluoroalkoxycarbonylalkoxy group, a $C_{3-30}$ fluorocycloalkoxy group, a $C_{5-30}$ fluorocycloalkoxycarbonylalkyl group, a $C_{5-30}$ fluorocycloalkoxycarbonylalkoxy group, a $C_{6-30}$ aryl group, a $C_{6-30}$ fluoroaryl group, a $C_{6-30}$ aryloxy group, a $C_{6-30}$ fluoroaryloxy group, or a $C_{2-30}$ acetal group comprising —O—C($R^{11}R^{12}$)—O— (wherein $R^{11}$ and $R^{12}$ are each independently hydrogen or a $C_{1-30}$ alkyl group), each of which is unsubstituted or substituted;

$Ar^1$ and $Ar^2$ are independently $C_{10-30}$ fused or singly bonded polycyclic aryl groups;

wherein X is S or I;

p is an integer of 2 or 3, wherein when X is I, p is 2, and wherein when X is S, p is 3, g and r are each independently an integer from 0 to 5, u is an integer from 0 to 1, wherein when u is 0, X is I, and wherein when u is 1, X is S, and s and t are each independently an integer from 0 to 4, wherein at least one of $R^h$, $R^i$, $R^j$, and $R^k$ is an acid-cleavable group.

4. The copolymer of claim 3, further comprising a polymerized product of an acid-deprotectable monomer, a base-soluble monomer, a lactone-containing monomer, or a combination thereof.

5. The copolymer of claim 4, wherein the acid-deprotectable monomer is represented by formula (II), the base-soluble monomer is represented by formula (III), and the lactone-containing monomer is represented by formula (IV):

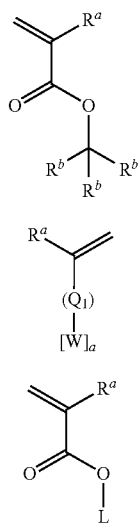

(II)

(III)

(IV)

wherein each $R^a$ is independently H, F, $C_{1-10}$ alkyl, or $C_{1-10}$ fluoroalkyl;

each $R^b$ is independently H, an unsubstituted or substituted $C_{1-20}$ alkyl group, an unsubstituted or substituted $C_{3-20}$ cycloalkyl group, an unsubstituted or substituted $C_{6-20}$ aryl group, or an unsubstituted or substituted $C_{7-20}$ aralkyl group, and each $R^b$ is separate or at least one $R^b$ is bonded to an adjacent $R^b$ to form a cyclic structure;

$Q_1$ is an ester-containing or non-ester containing group selected from an unsubstituted or substituted $C_{1-20}$ alkyl group, an unsubstituted or substituted $C_{3-20}$ cycloalkyl group, an unsubstituted or substituted $C_{6-20}$ aryl group, and an unsubstituted or substituted $C_{7-20}$ aralkyl group;

W is a base-reactive group comprising at least one selected from —C(=O)—OH; —C(CF$_3$)$_2$OH; —NH—SO$_2$—$Y^1$ where $Y^1$ is F or a $C_{1-4}$ perfluoroalkyl group; an aromatic —OH; and an adduct of any of the foregoing with a vinyl ether;

a is an integer of 1 to 3; and

L is a monocyclic, polycyclic, or fused polycyclic $C_{4-20}$ lactone-containing group.

6. A photoresist composition comprising a copolymer of any of claims 3 to 5.

7. The photoresist composition of claim 6, further comprising a non-polymerizable photoacid generator having formula $G^+A^-$, wherein $G^+$ has formula (VI):

(VI)

wherein

X is S or I, each $R^c$ is unsubstituted or substituted, halogenated or non-halogenated, and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ is optionally attached to one adjacent $R^c$ by a single bond, and z is 2 or 3, wherein when X is I, z is 2, or when X is S, z is 3; and wherein $A^-$ is a non-polymerizable organic anion.

8. The photoresist composition of claim 7, wherein $G^+$ has formula (VII), (VIII), or (IX):

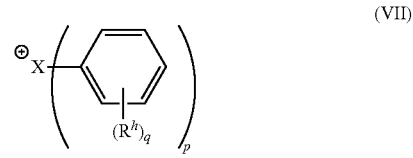

(VII)

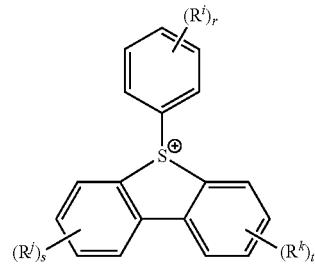

(VIII)

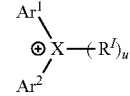

(IX)

wherein

X is I or S, $R^h$, $R^i$, $R^j$, and $R^k$ are unsubstituted or substituted and are each independently hydroxy, nitrile, halogen, a $C_{1-30}$ alkyl group, a $C_{1-30}$ fluoroalkyl group, a $C_{3-30}$ cycloalkyl group, a $C_{1-30}$ fluorocycloalkyl group, a $C_{1-30}$ alkoxy group, a $C_{3-30}$ alkoxycarbonylalkyl group, a $C_{3-30}$ alkoxycarbonylalkoxy group, a $C_{3-30}$ cycloalkoxy group, $C_{5-30}$ a cycloalkoxycarbonylalkyl group, a $C_{5-30}$ cycloalkoxycarbonylalkoxy group, a $C_{1-30}$ fluoroalkoxy group, a $C_{3-30}$ fluoroalkoxycarbonylalkyl group, a $C_{3-30}$ fluoroalkoxycarbonylalkoxy group, a $C_{3-30}$ fluorocycloalkoxy group, a $C_{5-30}$ fluorocycloalkoxycarbonylalkyl group, a $C_{5-30}$ fluorocycloalkoxycarbonylalkoxy group, a $C_{6-30}$ aryl group, a $C_{6-30}$ fluoroaryl group, a $C_{6-30}$ aryloxy group, a $C_{6-30}$ fluoroaryloxy group, or a $C_{2-30}$ acetal group comprising —O—C($R^{11}R^{12}$)—O— (wherein $R^{11}$ and $R^{12}$ are each independently hydrogen or a $C_{1-30}$ alkyl group), each of which is unsubstituted or substituted;

$Ar^1$ and $Ar^2$ are independently $C_{10-30}$ fused or singly bonded polycyclic aryl groups;

wherein X is S or I;

p is an integer of 2 or 3, wherein when X is I, p is 2, and wherein when X is S, p is 3, q and r are each independently an integer from 0 to 5, u is an integer from 0 to 1, wherein when u is 0, X is I, and wherein when u is 1, X is S, and s and t are each independently an integer from 0 to 4.

9. A coated substrate, comprising: (a) a substrate having one or more layers to be patterned on a surface thereof; and (b) a layer of a photoresist composition of any of claims 6 to 8 over the one or more layers to be patterned.

10. A method of forming an electronic device, comprising:
(a) applying a layer of the photoresist composition of any of claims 6 to 8 over a surface of the substrate;
(b) pattern-wise exposing the photoresist composition layer to activating radiation; and
(c) developing the exposed photoresist composition layer to provide a resist relief image.

11. A monomer having formula (I):

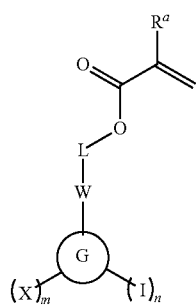

(I)

wherein in formula (I):
W is —(C=O)O—, —O(C=O)—, —O($SO_2$)—, —($SO_2$)O—, —NH($SO_2$)—, —($SO_2$)NH—, —NH(CO)—, —(CO)NH—, —$SO_2$—, or —SO—, $R^a$ is H, F, —CN, a $C_{1-10}$ alkyl group, or a $C_{1-10}$ fluoroalkyl group;

L is a linking group selected from an unsubstituted or substituted $C_{1-20}$ alkylene group, an unsubstituted or substituted $C_{3-20}$ cycloalkylene group, an unsubstituted or substituted $C_{6-20}$ arylene group, and an unsubstituted or substituted $C_{7-20}$ aralkylene group;

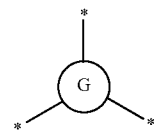

represents a monocyclic or polycyclic unsubstituted or substituted $C_{6-30}$ arylene group or a monocyclic or polycyclic unsubstituted or substituted $C_{3-30}$ heteroarylene group, wherein "*" indicates a point of attachment to a neighboring group or atom;

"I" represents iodine;

X is selected from a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, an unsubstituted or substituted $C_{2-30}$ alkenyl group, an unsubstituted or substituted $C_{2-30}$ alkynyl group, an unsubstituted or substituted $C_{3-30}$ cycloalkyl group, an unsubstituted or substituted $C_{1-30}$ heterocycloalkyl group, an unsubstituted or substituted $C_{3-30}$ cycloalkenyl group, an unsubstituted or substituted $C_{1-30}$ heterocycloalkenyl group, an unsubstituted or substituted $C_{6-30}$ aryl group, an unsubstituted or substituted $C_{6-30}$ aryloxy group, an unsubstituted or substituted $C_{6-30}$ arylthio group, an unsubstituted or substituted $C_{7-30}$ arylalkyl group, an unsubstituted or substituted $C_{1-30}$ heteroaryl group, an unsubstituted or substituted $C_{2-30}$ heteroaryloxy group, an unsubstituted or substituted $C_{2-30}$ heteroarylthio group, or an unsubstituted or substituted $C_{3-30}$ heteroarylalkyl group,
wherein X optionally comprises an acid-cleavable group;

m is an integer of 1 or greater, provided that when m is an integer of 2 or greater, two adjacent groups X optionally form a ring; and n is an integer of 1 or greater.

12. The monomer of claim 11, wherein
n is 1, 2, or 3.

13. The monomer of claim 11, wherein L is a $C_{1-20}$ alkylene group substituted with —F, a hydroxyl group, or a $C_{1-10}$ alkyl group.

14. The monomer of claim 11, wherein X comprises an acid-cleavable group.

* * * * *